(12) United States Patent
Ebrahimi et al.

(10) Patent No.: US 12,111,369 B2
(45) Date of Patent: Oct. 8, 2024

(54) MONITORING THE CONDITION OF A VIBRONIC SENSOR

(71) Applicant: Endress+Hauser SE+Co. KG, Maulburg (DE)

(72) Inventors: Mohammad Sadegh Ebrahimi, Lörrach (DE); Franco Ferraro, Schopfheim (DE); Romuald Girardey, Blotzheim (FR); Raphael Kuhnen, Schliengen (DE); Izabella Sandor, Schopfheim (DE); Ralf Wacker, Steinen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 134 days.

(21) Appl. No.: 17/756,327

(22) PCT Filed: Nov. 9, 2020

(86) PCT No.: PCT/EP2020/081424
§ 371 (c)(1),
(2) Date: May 23, 2022

(87) PCT Pub. No.: WO2021/099151
PCT Pub. Date: May 27, 2021

(65) Prior Publication Data
US 2022/0413067 A1    Dec. 29, 2022

(30) Foreign Application Priority Data
Nov. 21, 2019 (DE) .................. 10 2019 131 485.2

(51) Int. Cl.
*G01R 33/02* (2006.01)
*G01F 23/296* (2022.01)
(Continued)

(52) U.S. Cl.
CPC ......... *G01R 33/02* (2013.01); *G01F 23/2966* (2013.01); *G01K 7/36* (2013.01);
(Continued)

(58) Field of Classification Search
CPC ...... G01R 33/02; G01F 23/2966; G01K 7/36; G01N 9/002
See application file for complete search history.

(56) References Cited

U.S. PATENT DOCUMENTS

| 11,275,010 B2 * | 3/2022 | Kuhnen | ................ G01F 23/241 |
| 2004/0061511 A1 * | 4/2004 | Kawakatsu | ........... G01F 23/804 |
| | | | 324/707 |

(Continued)

FOREIGN PATENT DOCUMENTS

| CN | 204731193 U | 10/2015 |
| CN | 107407588 A | 11/2017 |

(Continued)

*Primary Examiner* — Dominic E Hawkins
(74) *Attorney, Agent, or Firm* — Mark A. Logan; Endress+Hauser (USA) Holding, Inc.

(57) ABSTRACT

A method for monitoring the condition of a coil, wherein the coil is part of a device for determining at least one process variable of a medium in a container, includes applying an electrical excitation signal to the coil and receiving an electrical reception signal from the coil, determining a first value for the reception signal at a first predefinable measurement time, comparing the first value for the reception signal at the first measurement time with a reference value, and determining a condition indicator for the coil on the basis of the comparison. Disclosed also is a device that is designed for carrying out the disclosed method.

12 Claims, 3 Drawing Sheets

(51) Int. Cl.
*G01K 7/36* (2006.01)
*G01N 9/00* (2006.01)
*G01N 11/16* (2006.01)

(52) U.S. Cl.
CPC ............ *G01N 9/002* (2013.01); *G01N 11/16* (2013.01); *G01N 2009/006* (2013.01)

(56) References Cited

U.S. PATENT DOCUMENTS

| | | | | |
|---|---|---|---|---|
| 2015/0135826 A1* | 5/2015 | Muller | ............ | G01F 23/296 73/290 V |
| 2018/0031460 A1* | 2/2018 | Brengartner | ............ | G01N 9/002 |
| 2018/0306764 A1* | 10/2018 | Huber | ............ | G01N 29/024 |

FOREIGN PATENT DOCUMENTS

| | | |
|---|---|---|
| CN | 109416273 A | 3/2019 |
| DE | 10118001 A1 | 10/2002 |
| DE | 102015112421 A1 | 2/2017 |
| DE | 102016125243 A1 | 6/2018 |
| DE | 102017114315 A1 | 1/2019 |
| DE | 102017115147 A1 | 1/2019 |
| EP | 1333256 A2 | 8/2003 |
| EP | 1502091 A1 | 2/2005 |
| JP | 9-98690 A | 4/1997 |
| JP | 2012120415 A | 6/2012 |

\* cited by examiner

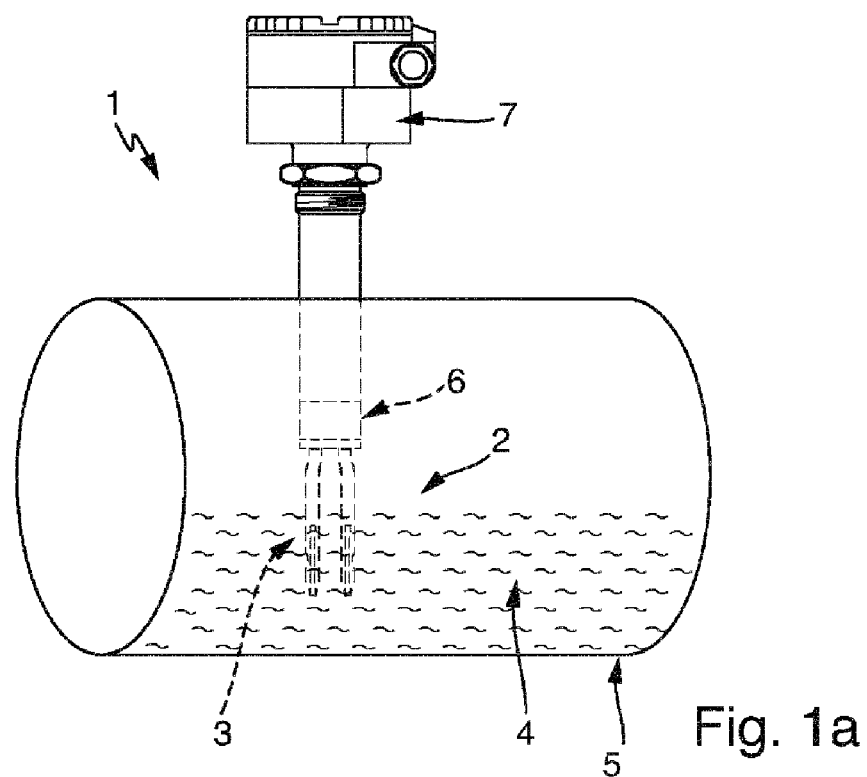
Fig. 1a
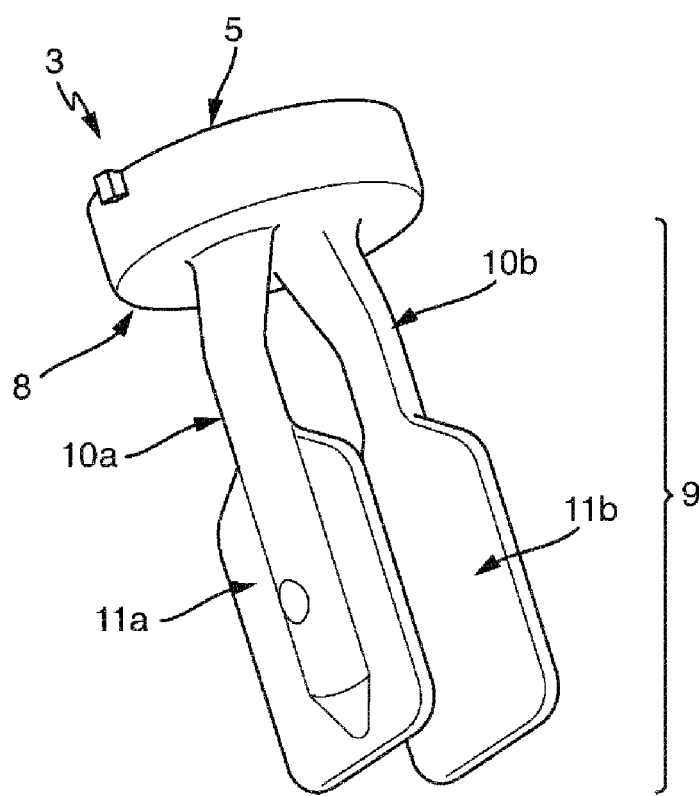
Fig. 1b
Fig. 1
(Prior Art)

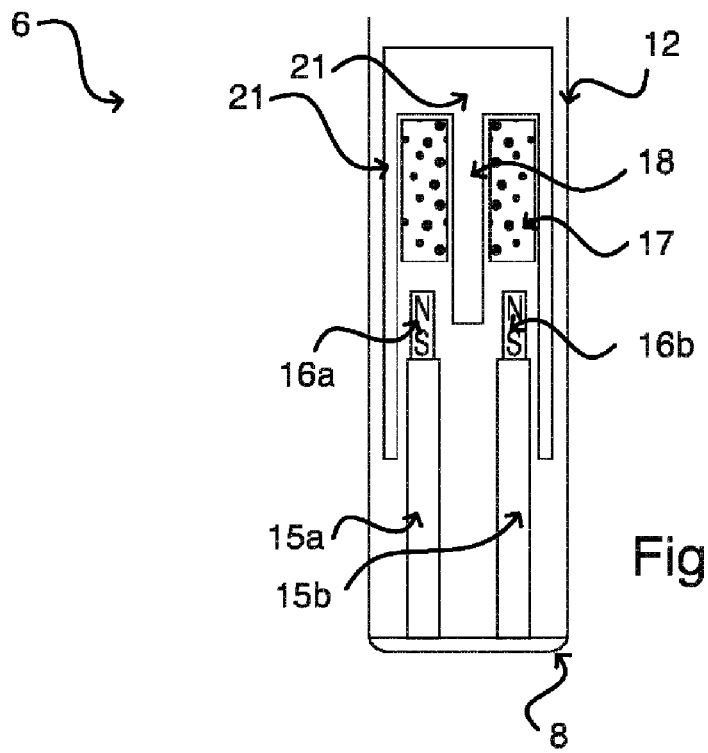
Fig. 2a
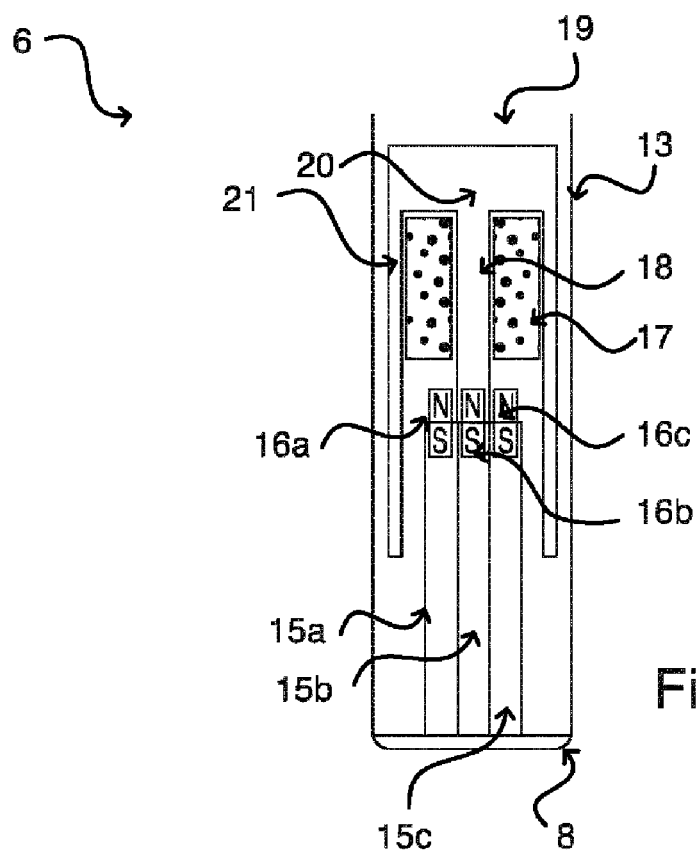
Fig. 2b
Fig. 2

MONITORING THE CONDITION OF A VIBRONIC SENSOR

CROSS-REFERENCE TO RELATED APPLICATIONS

The present application is related to and claims the priority benefit of DPMA Patent Application No. 10 2019 131 485.2, filed on Nov. 21, 2019, and International Patent Application No. PCT/EP2020/081424, filed on Nov. 9, 2020, the entire contents of which are incorporated herein by reference.

TECHNICAL FIELD

The invention relates to a method for monitoring the condition of a coil, which coil is part of a device for determining at least one process variable of a medium in a container, and to a device designed to implement a method according to the invention. The device is a vibronic sensor. The device comprises a mechanical vibration-capable unit, a driving/receiving unit, and an electronic unit. The process variable is, for example, given by the fill level, especially a limit level, the volumetric flow rate of the medium, or also by its density or viscosity. The medium is located, for example, in a receptacle, e.g. a container, a tank, or also in a pipeline. The medium itself is, for example, given by a liquid, a gas or a bulk material.

BACKGROUND

Vibronic sensors are often used in process and/or automation engineering. In the event of fill level measuring devices, they have at least one mechanical vibration-capable unit such as, for example, an oscillating fork, a single rod or a membrane. During operation, this is excited to mechanical vibrations by means of a driving/receiving unit, often in the form of an electromechanical transducer unit, which in turn can be a piezoelectric drive or an electromagnetic drive, for example. A wide variety of corresponding field devices are produced by the applicant and are distributed under the name LIQUIPHANT or SOLIPHANT, for example. The underlying measurement principles are known in principle from numerous publications. The driving/receiving unit excites the mechanical vibration-capable unit to mechanical vibrations by means of an electrical excitation signal. Conversely, the driving/receiving unit can receive the mechanical vibration of the mechanical vibration-capable unit and transduce these into an electrical reception signal. The driving/receiving unit is accordingly either a separate driving unit and a separate receiving unit, or a combination driving/receiving unit. In many instances, the driving/receiving unit is thereby part of a feedback electrical resonant circuit, by means of which the excitation of the mechanical vibration-capable unit to mechanical vibrations takes place. For example, the resonant circuit condition according to which the amplification factor is and all phases occurring in the resonant circuit result in a multiple of 360° must be fulfilled for a resonant vibration. To excite and fulfill the resonant circuit condition, a defined phase shift between the excitation signal and the reception signal must be ensured. A specifiable value for the phase shift, i.e., a target value for the phase shift between the excitation signal and the reception signal, is therefore frequently set. For this purpose, various solutions, both analog and digital methods, have become known from the prior art, as described, for example, in documents DE102006034105A1, DE102007013557A1, DE102005015547A1, DE102009026685A1, DE102009028022A1, DE102010030982A1, or DE00102010030982A1.

Both the excitation signal and the reception signal are characterized by their frequency $\omega$, amplitude A and/or phase $\phi$. Accordingly, changes in these variables are usually used to determine the respective process variable. The process variable can, for example, be a fill level, a specified fill level, or the density or the viscosity of the medium, and also the flow rate. In the case of a vibronic level switch for liquids, for example, a distinction is made between whether the vibration-capable unit is covered by the liquid or vibrates freely. These two conditions, the free condition and the covered condition, are differentiated, for example, on the basis of different resonant frequencies, i.e. on the basis of a frequency shift.

The density and/or viscosity, in turn, can only be determined with such a measuring device if the vibration-capable unit is covered by the medium. In connection with the determination of the density and/or viscosity, different possibilities have likewise become known from the prior art, such as those disclosed in documents DE10050299A1, DE102007043811A1, DE10057974A1, DE102006033819A1, DE102015102834A1, or DE102016112743A1.

Piezoelectric and/or electromagnetic driving/receiving units especially are used for the driving/receiving unit itself. Given driving/receiving units based on the piezoelectric effect, a comparatively high efficiency can normally be achieved. However, they are only conditionally suitable for use at high temperatures, in particular at temperatures above 300° C. An alternative is provided in this context by electromagnetic driving/receiving units, for example as described in the publications WO2007/113011, WO2007/114950 A1, DE102015104533A1, DE102016112308A1. The conversion of electrical energy into mechanical energy takes place here in each case via a magnetic field. The described transducer units therefore usually comprise at least one coil and a permanent magnet. A magnetic alternating field passing through the magnet is generated by means of the coil and a periodic force is transmitted to the vibratable unit via the magnet. Such a driving/receiving unit can be used, for example, for a temperature range between −200° C. and 500° C., depending on the materials used.

In order to ensure the reliable working of a vibronic sensor, a wide variety of methods are known from the prior art for the diagnosis of possible malfunctions of a vibronic sensor. The possibility of a condition monitoring or diagnosis is of great importance, especially in the event of safety-critical applications such as, for example, using a limit level switch in a container filled with a flammable liquid. Depending on the specific application, the respective measuring device must satisfy different safety requirements. In this regard, for example, what is known as the SIL standard (SIL stands for safety integrity level) has become known according to the IEC61508 standard specification, which distinguishes between four different levels for specifying the requirement for safety integrity of safety functions. In principle, the safety requirement level is thereby a measure of the reliability of the respective system or measuring device depending on a potential hazard. Typically provided safety functions for ensuring a defined level for the safety integrity are provided, for example, by emergency shutdown, or switching off overheated devices.

For example, the failure behavior of individual assemblies is investigated to establish a safety integrity level. Furthermore, the presence of redundant structures is checked, along with the relationship between safe and unsafe, or dangerous, errors. From such considerations, a total failure rate can then be determined using which the respective safety integrity level is associated with the respective system or measuring device.

DE102004027397A1 describes a possibility for detecting a cable break in a vibronic sensor. Diagnosis options for detecting coating in the region of the vibration-capable unit have become known from the documents DE10014724A1 and DE102009045204A1. However, diagnoses in the region of the driving/receiving unit of a vibronic sensor have also been proposed in a wide variety of embodiments, such as the diagnosis of a piezoelectric driving/receiving unit described in DE102008032887A1, for example. With respect to an electromagnetic driving/receiving unit, it has again been known from DE102017115147A1 to assess the condition of the driving/receiving unit on the basis of the overall ohmic resistance.

SUMMARY

Starting from the prior art, the object of the present invention is to provide a measuring device with which high safety requirements can be met in an especially simple manner.

With regard to the method, the object is achieved by a method for monitoring the condition of a coil, which coil is part of a device for determining at least one process variable of a medium in a container. The method comprises the following method steps:
 applying an electrical excitation signal to the coil, and receiving an electrical reception signal from the coil,
 determining a first value for the reception signal at a first predefinable measurement time,
 comparing the first value for the reception signal at the first measurement time with a reference value, and
 determining a condition indicator for the coil based on the comparison.

The diagnosis of the driving/receiving unit via a comparison of a measured value at a predefinable first measurement time with a reference value can be realized in an especially simple manner. The design cost especially is very low—the implementation of the condition monitoring requires only very few additional components for the respective sensor.

It is advantageous if the first predefinable measurement time is selected so that it lies in a predefinable first time interval in which the reception signal reacts, in the form of a step response, to a sudden change in the excitation signal. A step response is advantageously especially easy to evaluate. It is accompanied by a characteristic profile of the reception signal as a function of the time, which can be detected in a simple manner.

It is likewise advantageous if the excitation signal is a square wave signal. A square wave signal is characterized by a periodic change between two constant values, which has a rectangular profile plotted as a function of the time. It is thus characterized by periodic rising and falling edges. In this context, it is furthermore advantageous if the sudden change of the excitation signal is a rising or falling edge of the excitation signal.

A conclusion about an extent of a damage to the coil is preferably determined. Thus, not only a qualitative but also a quantitative conclusion about the condition of the coil is possible. Depending on the diagnosis of the condition of the coil that is rendered on the basis of the condition indicator, it is also conceivable to generate messages, for example, about a maintenance to be performed or about the presence of a defect.

It is likewise preferred to determine the condition indicator depending on the deviation of the measured value from the reference value. It is especially possible to check whether the deviation exceeds a predefinable limit value.

According to one embodiment of the method, the condition indicator is a conclusion about the presence of at least one winding short circuit in the region of the coil.

In this regard, it is advantageous if the presence of a winding short circuit in the region of the coil is detected on the basis of an underrun of the reference value at the first predefinable measurement time.

According to a further embodiment of the method, the condition indicator is a conclusion about a defective electrical contact or a cable break in the region of the coil or of at least two connection wires.

In this regard, it is again advantageous if the presence of a defective electrical contact or a cable break in the region of the coil is detected using a deviation of the step response of the reception signal in reaction to the sudden change in the excitation signal from a reference jump response. The step response of the reception signal in the event of an intact coil especially has an exponential profile. In this instance, a deviation from such a profile indicates the presence of a defective electrical contact.

In one embodiment, the method includes that a second value for the reception signal is determined at a second predefinable measurement time, and wherein a conclusion about a temperature of the medium is determined on the basis of the second value for the reception signal. In addition to the condition monitoring, the method according to the invention allows a determination of the temperature without the implementation of a further temperature-sensitive sensor element.

The temperature in the region of a vibronic sensor of the respective medium has a great influence on the determination of the respective process variable, especially on the respectively received reception signal. In order to compensate for this influence, it has become known from DE 102006007199A1 or DE 102005029490A1 to provide a vibronic measuring device with an additional temperature sensor. However, the integration of a further sensor into a measuring device is basically associated with a certain design cost. From DE102017114315A1, it has become known in turn, with respect to an electromagnetic driving/receiving unit, to determine the temperature of the medium on the basis of an electrical parameter, for example on the basis of the ohmic resistance of the coil. However, such a measure is also associated with a comparatively high cost, since means for determining the respective parameter are to be provided. By contrast, the temperature determination according to the invention, on the basis of a second value for the reception signal at a second predefinable measurement time, can be realized in an especially simple manner. This second value for the reception signal or the second predefinable measurement time is selected such that the second measured value has a direct dependence on the temperature of the medium and can be used directly for determining the temperature. Thus, no further sensor elements or complex design measures are necessary for temperature determination.

With regard to the temperature of the medium, it is also conceivable that the influence of the temperature on the reception signal is compensated for in continuous measuring operation of the device. In this way, the measurement accuracy of the respective sensor can be increased in determining the respective process variable.

In this context, it is advantageous if the temperature of the medium is determined using a comparison of the second value for the reception signal with at least one characteristic curve of the reception signal as a function of the temperature.

It is likewise advantageous if the second predefinable measurement time is selected so that it lies outside of the first time interval.

Preferably, the second predefinable measurement time is selected so that it lies within a second time interval in which the reception signal is essentially constant.

The object of the invention is further achieved by a device for determining and/or monitoring at least one process variable of a medium in a container, comprising at least one coil, which device is designed to implement a method according to at least one of the described embodiments. The method according to the invention can thereby be implemented simultaneously for continuous measuring operation, or alternately with the continuous operation during a diagnostic operating mode of the device. A manual, selective triggering of the method, for example via a switching operation or the like, is also conceivable.

With regard to the device, it is advantageous if the device involves a vibronic sensor comprising a mechanical vibration-capable unit, a driving/receiving unit with at least one coil, which driving/receiving unit is designed to excite the mechanical vibration-capable unit by means of an electrical excitation signal to produce mechanical vibrations and to receive the mechanical oscillations from the vibration-capable unit and transduce them into an electrical reception signal; and an electronics unit that is designed to generate the excitation signal starting from the reception signal, and to determine the at least one process variable from the reception signal.

In one embodiment of the device, the vibratable unit is a membrane, a single rod or a vibration fork.

A further embodiment of the device includes that the process variable is an, especially predefinable, fill level, the density or the viscosity of the medium.

Within the scope of the present invention, a wide variety of embodiments of a vibronic sensor, especially different driving/receiving units, may be used. In the following, without limiting generality, two especially preferred embodiments for a driving/receiving unit are specified.

In one embodiment, the driving/receiving unit comprises at least
- a membrane that can be set into mechanical vibration,
- two rods fastened to the membrane perpendicular to a base surface of the membrane,
- a housing, wherein the membrane forms at least a partial region of a wall of the housing, and wherein the two rods extend into the interior of the housing,
- two magnets, wherein one magnet each is fastened in the end region of one of the two rods facing away from the membrane, and
- a coil having a core mounted within the housing above the magnets, and which coil is energizable with an alternating current electrical signal,
- wherein the coil is designed to generate a magnetic field, which magnetic field sets the two rods into mechanical vibrations by means of the two magnets, and
- wherein the two rods are fastened to the membrane in such a way that vibrations of the membrane result from the vibrations of the two rods.

In a further embodiment, the driving/receiving unit comprises at least
- a membrane that can be set into mechanical vibration,
- at least three rods fastened to the membrane perpendicular to a base surface of the membrane,
- a housing, wherein the membrane forms at least a partial region of a wall of the housing, and wherein the rods extend into the interior of the housing,
- at least three magnets, wherein one magnet each is fastened in the end region facing away from the membrane to each of the at least three rods, and
- a coil having a core mounted within the housing above the magnets, and which coil is energizable with an alternating current electrical signal,
- wherein the coil is designed to generate a magnetic field, which magnetic field causes the rods to vibrate by means of the magnets,
- wherein the rods are fastened to the membrane in such a way that vibrations of the membrane result from the vibrations of the rods,
- wherein at least one of the rods is attached to the diaphragm essentially at a location along the base surface of the membrane,
- at which location the second derivation of the deflection of the diaphragm from a rest position, as a function of the location on the base surface, is essentially zero.

Moreover, a driving/receiving unit according to one of the two embodiments with four rods, described by way of example, is especially preferred. With regard to the two preferred embodiments described for the driving/receiving unit, reference is made to documents DE102015104533A1 and DE102016112308A1 in their entirety.

It is also noted that the embodiments described in connection with the method according to the invention can also be applied mutatis mutandis to the device according to the invention, and vice versa.

BRIEF DESCRIPTION OF THE DRAWINGS

The invention and its advantageous embodiments are described in more detail below with reference to Figures FIG. 1-FIG. 4. The following is shown:

FIG. 1 shows a representation of a vibronic sensor according to the prior art;

FIG. 2 shows two possible embodiments of a vibronic sensor with preferred electromagnetic driving/receiving units;

DETAILED DESCRIPTION

Figure 3:
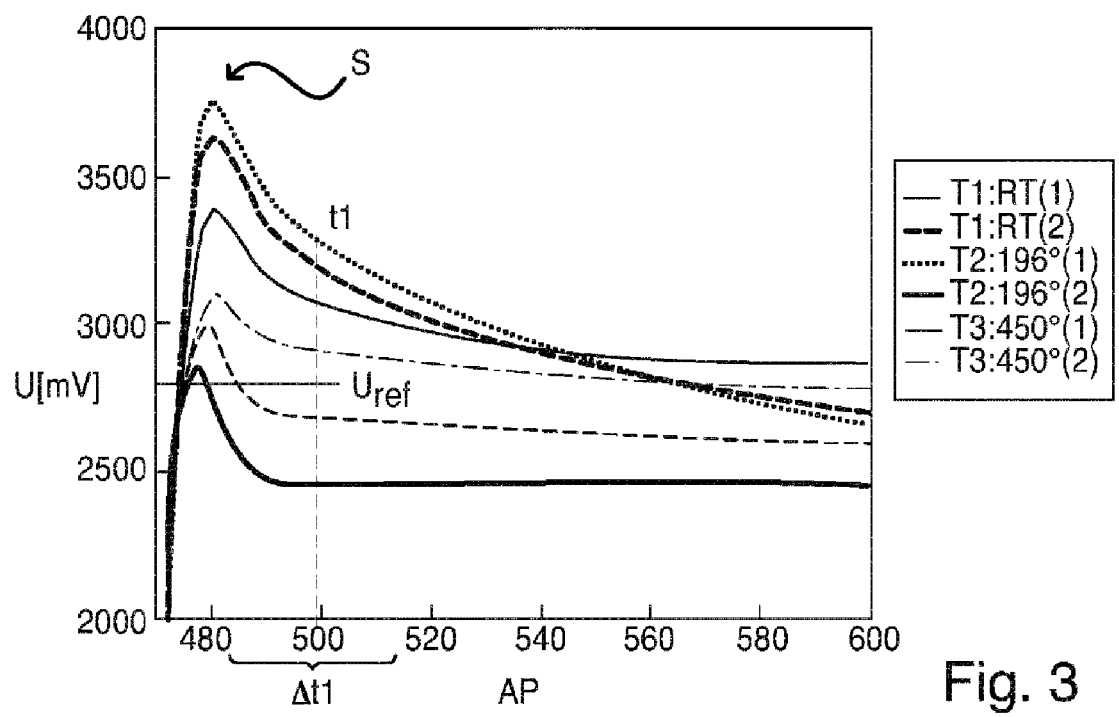
FIG. 3 shows a diagram of the reception signal of the coil for illustrating the condition monitoring according to the present disclosure.

FIG. 1a shows a vibronic fill level measuring device 1. A sensor unit 2 having a mechanically vibratable unit 3 is depicted in the form of a vibrating fork that is partially immersed into a medium 4, which is located in a container 5. The vibration-capable unit 3 is excited to mechanical vibrations by means of the driving/receiving unit 6, normally an electromechanical transducer unit, and can, for example, be a piezoelectric stack or bimorph drive, but also an electromagnetic or also magnetostrictive driving/receiving unit. However, it is naturally understood that other embodiments of a vibronic sensor are also possible. Furthermore, an electronics unit 7 is depicted by means of which the signal detection, evaluation and/or supply takes place.

FIG. 1b shows a more detailed view of a vibration-capable unit 3 in the form of a vibration fork, for example as is used for the vibronic sensor sold by the applicant under the name LIQUIPHANT. A membrane 8 and a vibrating element 9 connected thereto can be seen. The vibrating element 9 has two vibrating rods 10a, 10b, to each of which a paddle 11a, 11b is integrally formed at the end. In operation, the vibration fork 3 executes vibration movements according to the vibration mode with which it is excited. Each of the two vibrating rods 10a, 10b behaves essentially like a so-called bending vibrator. In the fundamental mode, the two vibrating rods 10a, 10b oscillate in counterphase with respect to one another, for example.

Although numerous different embodiments for the driving/receiving unit 6 may be used within the scope of the present invention, the following description relates, without limitation of the generality, to electromagnetic driving/receiving units 6 with at least one coil, as they are described in the documents DE102015104533A1 or DE102016112308A1. In the context of the present application, reference is made to both patent applications in their entirety.

FIG. 2a shows a schematic view of such a drive/receiving unit 6. A housing 12 terminates with the lower wall with a membrane 8, which is to be associated with the vibratable unit 3. For the embodiment shown here, the housing 12 is cylindrical and the disk-shaped membrane 8 has a circular cross-sectional area A. However, it goes without saying that other geometries are also conceivable and fall under the present invention. Two rods 15a, 15b are fastened to the diaphragm 8 perpendicular to the base surface A of the diaphragm 8 and extend into the interior of the housing 12. This is in particular a non-positive connection. The base surface A of the diaphragm 8 is then in a plane perpendicular to the longitudinal direction of the rods 15a, 15b.

A magnet 16a, 16b, in particular a SmCo or Alnico magnet, is fastened in each case in the end region of the rods 15a, 15b facing away from the membrane 8. The magnets 16a, 16b are preferably all oriented identically. A coil 17 that comprises a wire wound around the core 18 is arranged above the magnets 16a, 16b. The core 18 of the coil 17 is part of a cup-shaped armature unit 19 with a base 20 and a circumferential wall 21. For example, the base 20, like the base surface A of the membrane 8, can have a circular cross-sectional area. From the bottom 20 of the cup-shaped anchor unit 19, the core 18 of the coil 17 extends centrally into the interior of the anchor unit 19 in the form of a connecting piece. In this instance, the circumferential wall 21 then has the function of an internal magnetic field guide. The rods 15a, 15b having the magnets 16a and 16b do not contact the coil 17 and the core 18. In continuous operation, the coil 17 is subjected to an alternating current signal in order to generate an alternating magnetic field. For this purpose, the coil has two connecting wires, not shown in FIG. 2a.

Due to the alternating field, the rods 15a and 15b are deflected horizontally, i.e. perpendicularly or transversely to their longitudinal axis, via the magnets 16a and 16b in such a way that they are set into vibration. On the one hand, the rods 15a and 15b then have a lever effect, by means of which the bending of the rods 15a and 15b generated by the horizontal deflection is transmitted to the membrane 8 in such a way that the membrane 8 is set into vibration. On the other hand, the combination of the two rods 15a and 15b and the membrane 8 is, however, a separate resonator.

FIG. 2b shows an electromechanical transducer unit 6 similar to FIG. 2a with the difference that in FIG. 2b three rods 15a-15c and three magnets 16a-16c are present, as disclosed in DE 102016112308A1. However, the electromechanical transducer unit can also have four or more rods.

In the instance of the embodiments of FIG. 2, the two swing rods 10a, 10b form the mechanical vibration-capable unit 3 and the rods 15a-15c of the transducer unit 6, respectively with the membrane 8, form a mechanical resonator. The membrane 8 is preferably, but not necessarily, embodied in one piece. In particular, it can be assigned to both the vibratable unit 3 and the transducer unit 6.

According to the invention, a condition monitoring of a vibronic sensor is performed, with which a comparison is made with a reference value on the basis of a comparison of a first value of the reception signal at a predefinable first measurement time.

An embodiment of the condition monitoring of the coil 17 according to the invention is illustrated in FIG. 3. Respectively depicted is the reception signal U of the coil 17 as a function of the sampling point AP, in principle thus as a function of time, for different temperatures T1, T2, and T3 and for a fully functional coil (1) and a partially short-circuited coil (2). For the shown embodiment, the predefinable first measurement time t1 is at AP=500, and is selected so that it is in a predefinable first time interval Δt1, in which a step response S of the reception signal U is detectable as a result of an abrupt change of the excitation signal A [not shown here]. The excitation signal A is, for example, a square wave signal, and the step response S of the reception signal U takes place in reaction to a rising or falling edge of the excitation signal.

The first measurement time t1 is selected so that it lies temporally after the jump S of the reception signal U. For the embodiment shown here, the first measurement time t1 lies in a range in which the reception signal U decays exponentially after the step response S. The shown profile thereby corresponds to a rising edge of the excitation signal A.

It can be seen from the diagram that, at the first measurement time t1, the values for the reception signal U for all selected temperatures T1, T2, T3 for the functional coils 17 (1) is respectively greater than for the partially short-circuited coils (2). In this range, i.e. in the range of the first measurement interval Δt1, a reference value $U_{ref}$ can be established, which is provided so that all values $U>U_{ref}$ for the reception signal U correspond to functional coils 17, and all values $U<U_{ref}$ for the reception signal U correspond to partially short-circuited coils. Thus, if a first value for the reception signal U1 at the predefinable first measurement time t1 falls below the reference value $U_{ref}$, it is possible to conclude the presence of a partial short circuit in the region of the coil 17 from the underrun.

However, other conclusions regarding the condition of the coil 17 may also be generated by means of the method according to the invention. For example, using a comparison of the step response S with a reference jump response $S_{ref}$, the presence of a defective electrical contact or a cable break in the region of the coil can be detected.

Figure 4:
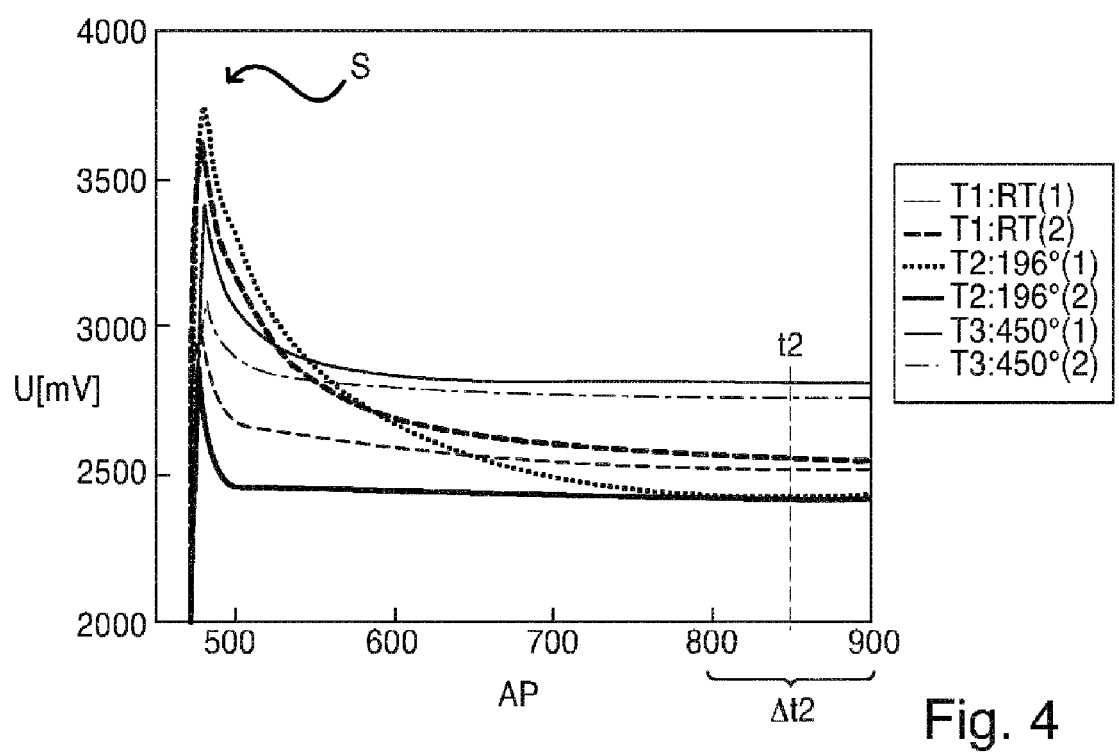
FIG. 4 shows a diagram of the reception signal of the coil to illustrate the temperature determination according to the present disclosure.

Moreover, in a further embodiment, the method according to the invention makes it possible to make a conclusion about the temperature T of the medium 4 in the container 5. For this purpose, a second value U2 of the reception signal U is determined at a second predefinable measurement time t2, as shown in FIG. 4. As in FIG. 3, in FIG. 4 profiles are shown for the reception signal U for three different temperatures T1, T2, T3, and respectively for a functional coil 17 (1) and a partially short-circuited coil 17 (2). In a second predefinable time interval Δt2 that is outside the first time interval Δt1, the reception signal U respectively has a substantially constant value. The values for the reception signals U thereby differ for each of the selected temperatures T1, T2, T3. By contrast, given the same temperature T, the values for the reception signals U barely differ for functional coils 17 (1) and those which are at least partially short-circuited (2). Based on a second value U2 for the reception signal U at the second predefinable measurement time T2, a conclusion about the temperature T of the medium 4 can accordingly be derived, for example by comparing the second value U2 for the reception signal U with a characteristic curve for the reception signal U as a function of the temperature T, which can be stored in the electronics unit 7 of the device 1, for example.

In summary, the present invention enables a condition monitoring for a vibronic sensor 1, and optionally additionally a determination of the temperature T of the medium 4, in an especially simple manner and especially without integration of further components into the vibronic sensor 1. The condition monitoring can take place in parallel or alternately to normal measuring operation of the sensor 1.

The invention claimed is:

1. A method for monitoring a condition of a coil, wherein the coil is part of a device for determining at least one process variable of a medium in a container, the method comprising:
   applying an electrical excitation signal to the coil and receiving an electrical reception signal from the coil;
   determining a first value for the reception signal at a first predefinable measurement time, wherein the first predefinable measurement time is selected so that it is within a predefinable first time interval in which the reception signal reacts, in the form of a step response, to a sudden change in the excitation signal;
   comparing the first value for the reception signal at the first measurement time with a reference value; and
   determining a condition indicator for the coil on the basis of the comparison.

2. The method according to claim 1,
   wherein the excitation signal is a square-wave signal.

3. The method according to claim 2,
   wherein the sudden change of the excitation signal is a rising edge or a falling edge of the excitation signal.

4. The method according to claim 1,
   wherein the condition indicator is a conclusion about the presence of at least one winding short circuit in the region of the coil.

5. The method according to claim 4, further comprising:
   detecting a winding short circuit in the region of the coil on the basis of an underrun of the reference value at the first predefinable measurement time.

6. A method for monitoring a condition of a coil, wherein the coil is part of a device for determining at least one process variable of a medium in a container, the method comprising:
   applying an electrical excitation signal to the coil and receiving an electrical reception signal from the coil;
   determining a first value for the reception signal at a first predefinable measurement time;
   comparing the first value for the reception signal at the first measurement time with a reference value; and
   determining a condition indicator for the coil on the basis of the comparison determining a second value for the reception signal at a second predefinable measurement time; and
   determining a temperature of the medium based on the second value for the reception signal.

7. The method according to claim 6,
   wherein the temperature of the medium is determined based on a comparison of the second value for the reception signal with at least one characteristic curve of the reception signal as a function of the temperature.

8. The method according to claim 6,
   wherein the second predefinable measurement time is selected so that it is outside of the first time interval.

9. The method according to claim 8,
   wherein the second predefinable measurement time is selected so that it is within a second time interval in which the reception signal is constant.

10. A device for determining and/or monitoring at least one process variable of a medium in a container, comprising:
    at least one coil,
    wherein the device is designed to implement a method for monitoring a condition of the at least one coil, the method including:
       applying an electrical excitation signal to the coil and receiving an electrical reception signal from the coil;
       determining a first value for the reception signal at a first predefinable measurement time, wherein the first predefinable measurement time is selected so that it is within a predefinable first time interval in which the reception signal reacts, in the form of a step response, to a sudden change in the excitation signal;
       comparing the first value for the reception signal at the first measurement time with a reference value; and
       determining a condition indicator for the coil on the basis of the comparison.

11. The device according to claim 10, wherein the device is a vibronic sensor and further comprises:
    a mechanical vibration-capable unit;
    a driving/receiving unit with the at least one coil, wherein the driving/receiving unit is designed to excite the mechanical vibration-capable unit to mechanical vibrations via an electrical excitation signal and to receive the mechanical vibrations from the vibration-capable unit and transduce them into an electrical reception signal; and
    an electronic unit designed to generate the excitation signal starting from the reception signal and to determine the at least one process variable from the reception signal.

12. A method for monitoring a condition of a coil, wherein the coil is part of a device for determining at least one process variable of a medium in a container, the method comprising:
    applying an electrical excitation signal to the coil and receiving an electrical reception signal from the coil;
    determining a first value for the reception signal at a first predefinable measurement time;
    comparing the first value for the reception signal at the first measurement time with a reference value;
    determining a condition indicator for the coil on the basis of the comparison, wherein the condition indicator is a conclusion about a defective electrical contact or a cable break in the region of the coil or of at least two connection wires; and detecting a defective electrical contact or a cable break in the region of the coil on the basis of a deviation of the step response of the reception signal in reaction to the sudden change in the excitation signal from a reference jump response.

* * * * *